United States Patent [19]

Mita

[11] Patent Number: 5,420,530

[45] Date of Patent: May 30, 1995

[54] VOLTAGE COMPARATOR WITH HYSTERESIS

[75] Inventor: Rikitaro Mita, Kawasaki, Japan

[73] Assignee: Canon Kabushiki Kaisha, Tokyo, Japan

[21] Appl. No.: 327,813

[22] Filed: Oct. 17, 1994

Related U.S. Application Data

[63] Continuation of Ser. No. 171,854, Dec. 22, 1993, abandoned, which is a continuation of Ser. No. 938,669, Sep. 1, 1992, abandoned, which is a continuation of Ser. No. 758,429, Sep. 3, 1991, abandoned, which is a continuation of Ser. No. 539,312, Jun. 18, 1990, abandoned, which is a continuation of Ser. No. 406,181, Sep. 13, 1989, abandoned, which is a continuation of Ser. No. 256,197, Oct. 11, 1988, abandoned, which is a continuation of Ser. No. 97,626, Sep. 16, 1987, abandoned.

[30] Foreign Application Priority Data

Sep. 18, 1986 [JP] Japan .................. 61-218070

[51] Int. Cl.⁶ ................. H03K 5/153; H03K 5/22
[52] U.S. Cl. ........................... 327/74; 327/77; 327/87
[58] Field of Search ............. 307/358, 359, 360, 362, 307/290, 494, 496

[56] References Cited

U.S. PATENT DOCUMENTS

| 4,259,601 | 3/1981 | Stein | 307/359 |
| 4,375,598 | 3/1983 | Sakai | 307/359 |
| 4,384,219 | 5/1983 | Davis | 307/359 |
| 4,408,132 | 10/1983 | Kuwahara | 307/359 |
| 4,556,805 | 12/1985 | Shosi | 307/359 |
| 5,319,265 | 6/1994 | Lim | 307/362 |

FOREIGN PATENT DOCUMENTS

| 0188226 | 10/1984 | Japan | 307/360 |
| 0025319 | 2/1986 | Japan | 307/362 |

*Primary Examiner*—Timothy P. Callahan
*Assistant Examiner*—Toan Tran
*Attorney, Agent, or Firm*—Fitzpatrick, Cella, Harper & Scinto

[57] ABSTRACT

A voltage comparator for comparing an input voltage with a comparison voltage having a hysteresis characteristic. The comparison voltage is derived by combining a voltage drop developed across a fixed resistor by supplying a constant current therethrough from a constant current source and a reference voltage from a constant voltage source.

4 Claims, 3 Drawing Sheets

VOLTAGE COMPARATOR WITH HYSTERESIS

This application is a continuation of application Ser. No. 08/171,854, filed Dec. 22, 1993, abandoned, which is a continuation of application Ser. No. 07/938,669, filed on Sep. 1, 1992, abandoned, which is a continuation of application Ser. No. 07/758,429, filed on Sep. 3, 1991, abandoned, which is a continuation of application Ser. No. 07/539,312, filed on Jun. 18, 1990, abandoned, which is a continuation of application Ser. No. 07/406,181, filed on Sep. 13, 1989, abandoned, which is a continuation of application Ser. No. 07/256,197, filed on Oct. 11, 1988, abandoned, which is a continuation of application Ser. No. 07/097,626, filed on Sep. 16, 1987, abandoned.

BACKGROUND OF THE INVENTION

1. Field of the Invention

The present invention relates to a voltage comparator, and more particularly to an improvement in a circuit having a hysteresis characteristic.

2. Related Background Art

In a voltage comparator, when an input voltage which is a DC voltage approaches a comparison voltage, an output of the comparator is repeatedly turned on and off and assumes an oscillation state. This is not desirable in a circuit operation.

In order to avoid such a phenomenon, the voltage comparator is usually designed to have a hysteresis characteristic as shown in FIG. 1.

FIG. 2 shows a prior art voltage comparator numeral 1 denotes a power supply terminal to which a power supply voltage is applied, numeral 2 denotes an input terminal to which an input voltage is applied, numeral 3 denotes an output terminal from which an output voltage is produced, and numeral 4 denotes a voltage source, $Q_1$, $Q_2$, $Q_A$ and $Q_9$ denotes NPN transistors, $Q_3$ and $Q_4$ denote PNP transistors and $R_A$, $R_B$, $R_C$, $R_3$, $R_4$ and $R_5$ denote resistors.

In the circuit shown in FIG. 2, as the transistor $Q_A$ is turned on from its turn-off state, a comparison voltage changes from $$V_{CC} \times \frac{R_B + R_C}{R_A + R_B + R_C} \text{ to } V_{CC} \times \frac{R_B}{R_A + R_B},$$

and a difference therebetween serves as a hysteresis voltage.

In this circuit, relatively accurate comparison voltage and hysteresis voltage are obtained if the power supply voltage $V_{CC}$ is stable and constant, but if the power supply voltage varies, those voltages vary. Accordingly, this comparator is not appropriate to an application where accuracy in absolute value is required.

FIG. 3 shows another prior art voltage comparator. The like elements to those shown in FIG. 2 are designated by the like numerals and explanation thereof is omitted.

$Q_B$ and $Q_{10}$ denote PNP transistors, $R_D$, $R_E$ and $R_6$ denote resistors and $V_R$ denotes a reference voltage.

In this circuit, when an input voltage is high, the reference voltage $V_R$ is used as a comparison voltage, and when the input voltage is lower than the reference voltage $V_R$ and the transistor $Q_B$ is turned on, the comparison voltage rises by $$(V_{CC} - V_R) \times \frac{R_E}{R_D + R_E}.$$

Thus, a hysteresis voltage is attained.

In this circuit, since the reference voltage $V_R$ is used, the comparison voltage is not affected by the variation of the power supply voltage $V_{CC}$, but the hysteresis voltage is affected by the power supply voltage $V_{CC}$ and an output impedance of the reference voltage $V_R$, as a result, the accuracy is not assured.

SUMMARY OF THE INVENTION

It is an object of the present invention to provide a voltage comparator in which a comparison voltage and a hysteresis voltage are not affected by a variation of a power supply voltage and which assures high precision.

In order to achieve the above object, in accordance with the present invention, the comparison voltage has a hysteresis characteristic determined by a current supplied from a stable constant current source.

Namely, in the voltage comparator in which the comparison voltage has a hysteresis characteristic and it is compared with an input voltage, the comparison voltage is produced by combining a voltage drop developed by supplying a constant current from a constant current source to a fixed resistor and a reference voltage from a constant voltage source.

In accordance with the present invention, a comparison voltage having a stable hysteresis characteristic is attained and the input voltage is compared with high precision.

DETAILED DESCRIPTION OF THE PREFERRED EMBODIMENTS

An embodiment of the present invention is explained in detail with reference to the drawings.

Figure 1:
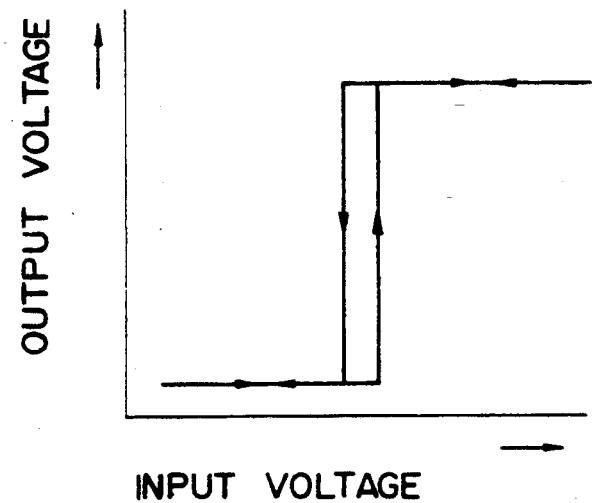
FIG. 1 illustrates a conventional hysteresis characteristic.
Figure 2:
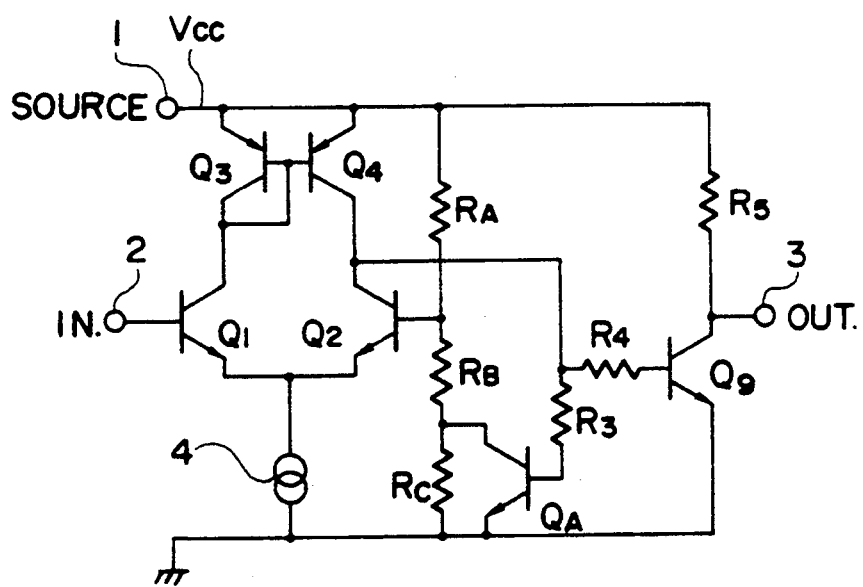
FIG. 2 shows a conventional voltage comparator.
Figure 3:
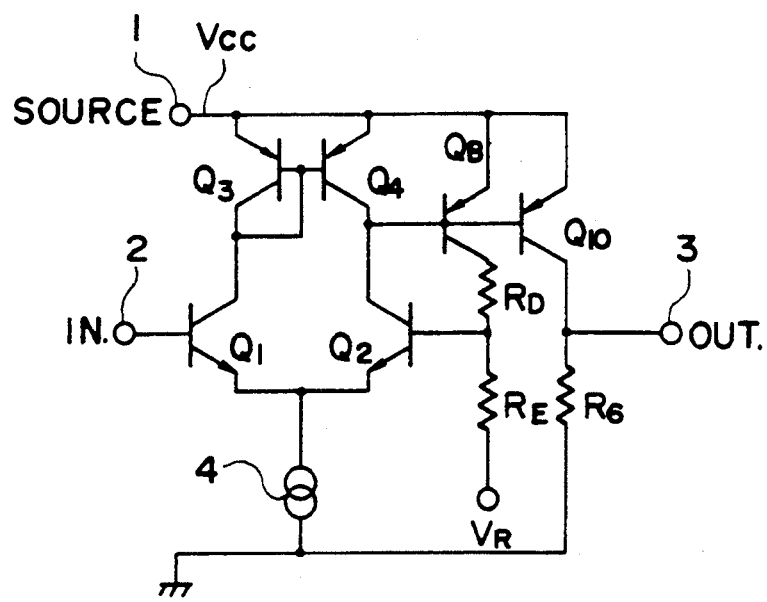
FIG. 3 shows another conventional voltage comparator.
Figure 4:
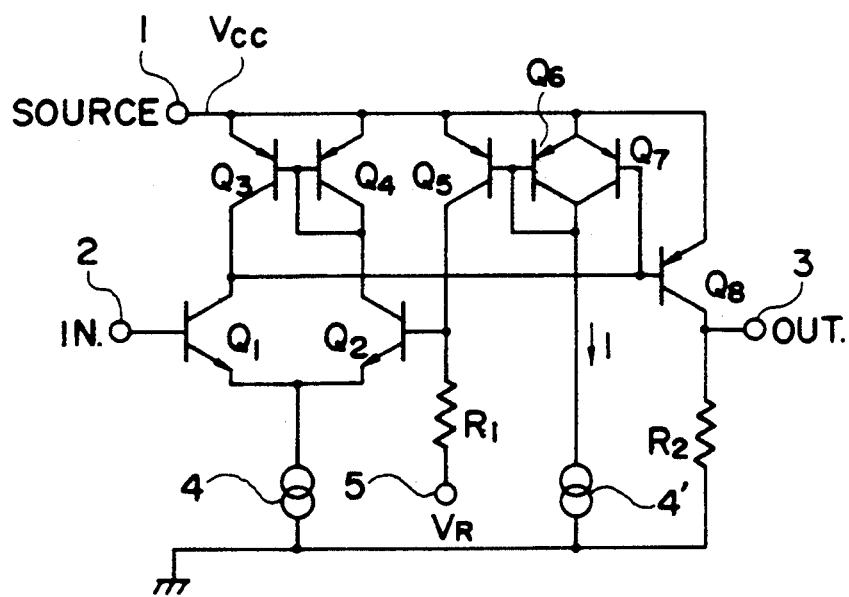
FIG. 4 shows one embodiment of the present invention.

FIG. 4 shows a circuit diagram of one embodiment of the present invention. Numeral 1 denotes a power supply terminal, numeral 2 denotes an input terminal, numeral 3 denotes an output terminal and numerals 4 and 4' denote constant current sources. $Q_1$ and $Q_2$ denote NPN transistors, $Q_3 \sim Q_8$ denote PNP transistors, $R_1$ and $R_2$ denote resistors, $V_R$ denotes a reference voltage and numeral 5 denotes a reference voltage input terminal to which the reference voltage $V_R$ is applied.

The input terminal 2 is connected to a base of the NPN transistor $Q_1$. An emitter of the NPN transistor $Q_1$ is connected to the constant current source 4 and an emitter of the NPN transistor $Q_2$. The other terminal of the constant current source 4 is grounded.

A collector of the NPN transistor $Q_1$ is connected to a collector of the PNP transistor $Q_3$ and bases of the PNP transistors $Q_7$ and $Q_8$. A collector of the NPN transistor $Q_2$ is connected to a collector of the PNP transistor $Q_4$ and a base of the NPN transistor $Q_2$ is connected to a collector of the PNP transistor Q₅ and one end of the resistor R₁. The other end of the resistor R₁ is connected to the reference voltage input terminal 5.

An emitter of the PNP transistor Q₃ is connected to the power supply terminal 1, and a base thereof is connected to base and collector of the PNP transistor Q₄. An emitter of the PNP transistor Q₄ is connected to the power supply terminal 1. An emitter of the PNP transistor Q₅ is connected to the power supply terminal 1, and a base thereof is connected to base and collector of the PNP transistor Q₆ and the constant current source 4'. The other terminal of the constant current source 4' is grounded.

An emitter of the PNP transistor Q₆ is connected to an emitter of the PNP transistor Q₇ and the power supply terminal 1. A collector of the PNP transistor Q₆ is connected to a collector of the PNP transistor Q₇. An emitter of the PNP transistor Q₈ is connected to the power supply terminal 1 and a collector thereof is connected to one end of the resistor R₂ and the output terminal 3. The other end of the resistor R₂ is grounded.

An operation of the present embodiment is explained in sequence.

When an input voltage applied to the input terminal 2 is sufficiently higher than the reference voltage $V_R$, the NPN transistor Q₁ is turned on and draws base currents of the PNP transistors Q₇ and Q₈. Thus, the PNP transistor Q₈ is turned on and the output terminal 3 assumes a high level. As the PNP transistor Q₇ turns on, the collector voltage of the PNP transistor Q₇ drops from the power supply voltage $V_{CC}$ by a saturation voltage. Since the saturation voltage is lower than a forward voltage which causes the PNP transistor Q₆ to turn on, the PNP transistor Q₆ is turned off and hence the PNP transistor Q₅ is also turned off. As a result, no current flows through the resistor R₁ and the reference voltage $V_R$ is applied to the base of the NPN transistor Q₂.

When the input voltage is lower than the reference voltage $V_R$, the NPN transistor Q₁ is turned off and the PNP transistors Q₇ and Q₈ are turned off, the output voltage at the output terminal 3 is rendered low level and the PNP transistor Q₆ is turned on. A current I determined by the constant current source 4' flows through the PNP transistor Q₆. Since the PNP transistors Q₅ and Q₆ constitute a current mirror circuit, a current which is substantially equal to I flows through the PNP transistor Q₅.

The voltage applied to the base of the NPN transistor Q₂ rises to a sum of the reference voltage $V_R$ and a voltage drop IR₁ across the resistor R₁. As the input voltage again rises, the output voltage does not change until the input voltage reaches a comparison voltage $V_R + IR_1$. Thus, the voltage IR₁ serves as a hysteresis characteristic voltage.

Figure 5:
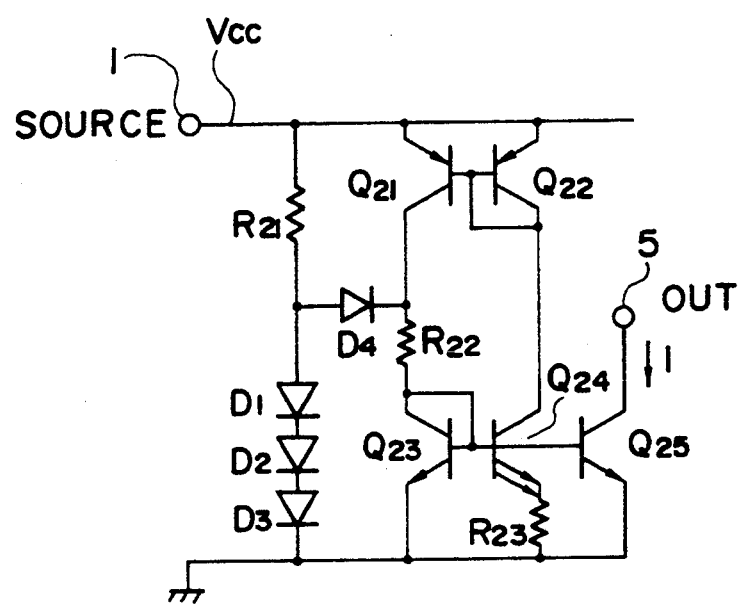
FIG. 5 shows a constant current source in the embodiment.

FIG. 5 shows a circuit diagram of the constant current source in the embodiment. Numeral 1 denotes the power supply terminal, and numeral 5 denotes a constant current output terminal. D₁, D₂, D₃ and D₄ denote diodes, R₂₁, R₂₂ and R₂₃ denote resistors, and the diode D₁ to D₄ and the resistor R₂₁ constitute a start circuit. Q₂₁ and Q₂₂ denote PNP transistors and Q₂₃, Q₂₄ and Q₂₅ denote NPN transistors.

An operation of the constant current circuit of FIG. 5 is explained.

The resistor R₂₂ is selected such that IR₂₂ = 2 $V_D$ (where $V_D$ is a forward voltage of the diode) is met by the collector current I of the PNP transistor Q₂₁. When the power supply voltages $V_{CC}$ applied, currents are supplied to the NPN transistors Q₂₃, Q₂₄ and Q₂₅ through the resistor R₂₂. When the constant current circuit becomes steady state, a voltage drop across the diode D₄ is zero and is non-conductive so that the start circuit is isolated.

The NPN transistor Q₂₄ has an emitter area which is twice as large as that of the NPN transistor Q₂₃, and the PNP transistors Q₂₁ and Q₂₂ have equal emitter area.

The collector currents $I_{C23}$ and $I_{C24}$ of the NPN transistors Q₂₃ and Q₂₄, the emitter areas $A_{E23}$ and $A_{E24}$ and the base emitter electrode $V_{BE23}$ and $V_{BE24}$ have the following relationship.

$$I_{C24} \times R_{23} = V_{BE23} - V_{BE24}$$
$$= V_T \log \frac{I_{C23}}{I_{C24}} \cdot \frac{A_{E24}}{A_{E23}} = V_T \log 2$$

$$(\because I_{C21} = I_{C23} = I_{C22} = I_{C24}, A_{E24}/A_{E23} = 2)$$

where $V_T$ is a thermal voltage of the transistor.

Since the NPN transistor Q₂₃, Q₂₄ and Q₂₅ constitute a current mirror circuit, the current I of the constant current output terminal 6 is given by $$I = I_{C24} = \frac{V_T \log 2}{R_{23}}$$

Thus, the current I from the constant current output terminal 6 of the constant current circuit does not depend on the power supply voltage.

In accordance with the present embodiment, the circuit which is hardly affected by the power supply voltage is used as the constant current source which develops the hysteresis characteristic voltage of the voltage comparator. As a result, a high precision and stable hysteresis characteristic voltage is produced.

I claim:

1. A voltage comparator for comparing an input voltage with a comparison voltage having a first value and a second higher value, comprising:
   a fixed resistor;
   a constant voltage source for providing a reference voltage as the first value of the comparison voltage through the fixed resistor;
   means for determining whether the input voltage is lower than the first value of the comparison voltage signal; and
   means for supplying a constant current through said fixed resistor for developing a voltage drop, the voltage drop being combined with the first value from the constant voltage source to increase the voltage comparison signal from the first value to the second value after and in response to said determining means determining that the input voltage is lower than the first value of the comparison voltage signal;
   wherein said means for supplying a constant current comprises:
   a power source;
   a ground;
   at least first and second current mirror circuits,
   with the first current mirror circuit including first and second transistors each having a base, collector and emitter, with the base of the first and second transistors being connected in common and to one of the collector and emitter of the second transistor, one of the emitter and collector of the first and second transistors being connected in common and to said power source, with the second current mirror circuit including third and fourth transistors each having a base collector and emitter, with the base of the third and fourth transistors being connected in common and to one of the collector and emitter of the third transistor, one of the emitter and collector of the third transistor being connected to said ground, one of the emitter and collector of the fourth transistor being connected to said ground through a first resistor, the other of the emitter and collector of the third transistor and the common base connection being connected to one end of a second resistor, with the other end of the second resistor being connected to the other of the emitter and collector of the first transistor, and the other of the emitter and collector of the fourth transistor being connected to the other of the emitter and collector of the second transistor;

a fifth transistor having a base, collector and emitter, with the base being connected in common with the base of each of the third and fourth transistors, one of the collector and emitter being connected to said ground, and the other of the emitter and collector being a constant current output terminal for said means for supplying a constant current;

a third resistor connected at one end to said power source;

a plurality of serially connected diodes connected at one end to the other end of said third resistor, and at another end to said ground; and a single diode connected at one end to the connection between said third resistor and said plurality of serially connected diodes, and connected at another end to the connection between the second resistor and the other of the emitter and collector electrode of the first transistor.

2. A comparator according to claim 1, wherein the resistance of the second resistor is chosen according to the relation:

second resistor $\simeq 2VD/I$, wherein VD is a forward bias voltage of said plurality of serially connected diodes, and I is one of a collector and emitter current of the first transistor.

3. A comparator according to claim 2, wherein the fourth transistor has an emitter having an emitter area AE4 at the connection to the first resister, and the third transistor has an emitter area AE3, and the areas meet a relation $AE3 < AE4$.

4. A comparator according to claim 3, wherein the areas meet a relation: $2AE3 = AE4$.

* * * * *

UNITED STATES PATENT AND TRADEMARK OFFICE
CERTIFICATE OF CORRECTION

PATENT NO. : 5,420,530
DATED : May 30, 1995
INVENTOR(S) : RIKITARO MITA

It is certified that error appears in the above-identified patent and that said Letters Patent is hereby corrected as shown below:

COLUMN 1

Line 32, "comparator" should read --comparator, wherein--.
Line 39, "denotes" should read --denote--.

COLUMN 2

Line 54, "$Q_3 \sim Q_8$" should read --$Q_3$ to $Q_8$--.
Line 65, "and" should read --and the--.

COLUMN 6

Line 17, "$\sim 2VD/I,$" should read -- $= 2VD/I,$ --.
Line 23, "resister," should read --resistor,--.

Signed and Sealed this

Third Day of October, 1995

Attest:

BRUCE LEHMAN

Attesting Officer

Commissioner of Patents and Trademarks